US010247378B2

(12) United States Patent
Kim

(10) Patent No.: US 10,247,378 B2
(45) Date of Patent: Apr. 2, 2019

(54) METAL PCB, HEADLIGHT MODULE HAVING METAL PCB APPLIED THERETO, AND METHOD FOR ASSEMBLING HEADLIGHT MODULE

(71) Applicant: ECOCAB.CO., LTD, Ulsan (KR)

(72) Inventor: Chang-Won Kim, Busan (KR)

(73) Assignee: ECOCAB.CO., LTD, Ulsan (KR)

( * ) Notice: Subject to any disclaimer, the term of this patent is extended or adjusted under 35 U.S.C. 154(b) by 0 days.

(21) Appl. No.: 15/745,363

(22) PCT Filed: Dec. 28, 2016

(86) PCT No.: PCT/KR2016/015405
§ 371 (c)(1),
(2) Date: Jan. 16, 2018

(87) PCT Pub. No.: WO2017/116142
PCT Pub. Date: Jul. 6, 2017

(65) Prior Publication Data
US 2018/0209604 A1    Jul. 26, 2018

(30) Foreign Application Priority Data

Dec. 31, 2015  (KR) .................. 10-2015-0190931
Dec. 31, 2015  (KR) .................. 10-2015-0190933
(Continued)

(51) Int. Cl.
*B60Q 1/00* (2006.01)
*F21S 41/19* (2018.01)
(Continued)

(52) U.S. Cl.
CPC ........... *F21S 41/192* (2018.01); *F21S 41/141* (2018.01); *F21S 43/14* (2018.01); *F21S 43/195* (2018.01);
(Continued)

(58) Field of Classification Search
CPC ..... B60Q 1/237; F21S 41/192; H01L 23/5387
(Continued)

(56) References Cited

U.S. PATENT DOCUMENTS

2014/0063805 A1* 3/2014 Song .................. F21V 29/50
362/249.01
2015/0103539 A1* 4/2015 Lee .................... F21S 43/15
362/382

FOREIGN PATENT DOCUMENTS

JP  2000-100216 A  4/2000
JP  2006-216436 A  8/2006
(Continued)

*Primary Examiner* — Diane I Lee
*Assistant Examiner* — Keith G. Delahoussaye
(74) *Attorney, Agent, or Firm* — Novick, Kim & Lee, PLLC; Jae Youn Kim

(57) ABSTRACT

Provided are a metal PCB, a headlight module having the metal PCB applied thereto, and a method for assembling the headlight module, wherein the metal PCB has a base made of a metal material and configured as a thin plate, or the base has a predetermined thickness and is bent in a desired direction through a bending groove formed on the rear surface thereof, and the base has a plurality of chip mounting portions integrated thereon such that one or more LED chips are mounted thereon, the chip mounting portions being spaced at a predetermined interval and having at least two parts of incision surfaces formed on one side of the base such that the chip mounting portions are inclined and installed to have a predetermined angle with regard to the base.

12 Claims, 21 Drawing Sheets

| (30) | Foreign Application Priority Data | | |
|---|---|---|---|
| Dec. 31, 2015 | (KR) | ........................ | 10-2015-0190941 |
| Nov. 7, 2016 | (KR) | ........................ | 10-2016-0147369 |
| Nov. 7, 2016 | (KR) | ........................ | 10-2016-0147372 |
| Nov. 7, 2016 | (KR) | ........................ | 10-2016-0147373 |

(51) Int. Cl.
  *H01L 33/64* (2010.01)
  *H05K 1/02* (2006.01)
  *H05K 1/05* (2006.01)
  *H05K 1/18* (2006.01)
  *F21V 29/503* (2015.01)
  *F21V 29/89* (2015.01)
  *F21S 41/141* (2018.01)
  *F21S 45/47* (2018.01)
  *H01L 23/538* (2006.01)
  *H01L 25/075* (2006.01)
  *H01L 33/62* (2010.01)
  *F21S 43/19* (2018.01)
  *F21S 43/14* (2018.01)
  *F21Y 115/10* (2016.01)

(52) U.S. Cl.
  CPC ............ *F21S 45/47* (2018.01); *F21V 29/503* (2015.01); *F21V 29/89* (2015.01); *H01L 23/5387* (2013.01); *H01L 25/0753* (2013.01); *H01L 33/62* (2013.01); *H01L 33/64* (2013.01); *H01L 33/641* (2013.01); *H01L 33/647* (2013.01); *H05K 1/02* (2013.01); *H05K 1/05* (2013.01); *H05K 1/18* (2013.01); *F21Y 2115/10* (2016.08); *H01L 2933/0066* (2013.01); *H01L 2933/0075* (2013.01)

(58) Field of Classification Search
  USPC ...................................................... 362/547
  See application file for complete search history.

(56) References Cited

FOREIGN PATENT DOCUMENTS

| KR | 10-2008-0105515 A | 12/2008 |
|---|---|---|
| KR | 10-2012-0076197 A | 7/2012 |
| KR | 10-1344361 B1 | 12/2013 |
| KR | 10-1435451 B1 | 8/2014 |
| KR | 10-2015-0142487 A | 12/2015 |
| KR | 10-1589017 B1 | 1/2016 |

* cited by examiner

METAL PCB, HEADLIGHT MODULE HAVING METAL PCB APPLIED THERETO, AND METHOD FOR ASSEMBLING HEADLIGHT MODULE

TECHNICAL FIELD

The present invention relates to a metal PCB, including a base of a metal material which is formed of a thin plate or has a specific thickness and is bent in a desired direction through bending grooves provided in a back surface, wherein cut faces of at least two parts are formed on one side of the base, spaced apart from one each other at a specific interval, disposed to be inclined at a specific angle to the base, and integrated with a plurality of chip mounting parts on which one or more LED chips are mounted, a headlight module to which the metal PCB is applied, and a method of assembling the headlight module.

BACKGROUND ART

In general, a printed circuit board (PCB) refers to a wiring board on which electronic parts are mounted to electrically connect parts or signal lines.

Furthermore, the PCB is completed by compressing a copper foil against one side or both sides of an insulating plate, such as phenol resin and epoxy resin, forming a conductive pattern according to a circuit, configuring the circuit by removing the copper foil through the corrosion of an unnecessary portion, perforating a via for connecting electronic parts into the PCB, performing plating, and coating a top surface and bottom surface with photo solder resist (PSR) ink.

Furthermore, the LED is chiefly used in the liquid crystal display device (LCD) of a mobile phone, an electronic display board, and a dashboard for a vehicle because it has low consumption power, has long lifespan and does not generate a contaminant, such as environment pollution.

As the LED recently has a wider application, it is applied to common lamps or the headlight of a vehicle in addition to the indoor light or signboard of a vehicle and the backlight unit (BLU) of an LCD device.

In particular, an LED lamp module (M) applied to the headlight of a vehicle is configured to include a reflector, for reflecting light generated by an LED, a board for controlling the mounted LED through the supply of power, a heat sink for externally discharging heat generated by the LED, and a back cover on which the heat sink is mounted.

Furthermore, recently, there was pointed out that a board used for various parts, including the LED, has a low heat-dissipation effect. In order to solve this problem, a metal board adopting metal materials, such as aluminum or a copper alloy, (hereinafter a metal board) has been in the spotlight in the market.

In particular, recently, in relation to the demands for a metal board on which an LED is mounted, there emerges a demand for a metal board on which an LED is mounted which is capable of being mechanically formed, such as curving or pressing.

The technology of a conventional metal PCB assembly for a vehicle lamp related to such a technology is proposed in Korean Patent No. 1589017. In its configuration, as in FIG. 1, the metal PCB assembly 10 for a vehicle lamp includes a metal PCB 14; at least one unit pattern (not shown) disposed on the metal PCB 14, having three faces cut and one face connected to the metal PCB 14, and protruded from the metal PCB 14 at a specific angle in the inclined state; and a projected matter coupled to the metal PCB 14 and enabling a support part protruded toward a horizontal surface to support the unit pattern and maintain a specific angle. The assembly of the metal PCB 14 includes a bending groove 24 of a specific depth formed at the bottom of the metal board 22 and bends each unit pattern on which each LED is mounted by forward pushing the unit pattern based on the bending groove, thereby fabricating the metal PCB assembly 10 having a stepped shape with a small power.

In this case, the external three faces 20a, 20b and 20c of the unit pattern are also cut. Since one face 20d of the unit pattern has been integrated and connected to the metal PCB 14, the unit pattern is not fully separated from the metal PCB 14 and is inclined at a specific angle and protruded with one side connected to the metal PCB 14.

However, such a metal PCB assembly for a vehicle lamp has disadvantages in that it has a configuration in which the unit pattern is bent, the unit patterns must be spaced apart in forming the external three faces for bending and it is difficult to mount the LED chips at a desired degree of integration.

Furthermore, a technology for an LED lamp module is proposed by Korean Patent No. 1344361. As in FIG. 2, the LED lamp module includes a reflector bar 100 for reflecting light generated by LEDs and a PCB 200 detachably mounted on the back surface of the reflector bar 100 in a one-touch manner, for controlling the LEDs. The PCB 200 is equipped with heat sinks 210 corresponding to the respective reflectors 110. The PCB 200 is detachably mounted on the reflector bar 100 through the heat sinks 210.

Furthermore, at least two stoppers 111 and guide protrusions 112 are formed at each location of the back surface of the reflector 110. The stoppers 111 are coupled to the heat sink 210 in a one-touch manner, and the guide protrusions 112 function to provide guidance so that the PCB 200 and the heat sink 210 are located at their regular position.

However, such an LED lamp module has disadvantages in that heat-dissipation efficiency is low because the area of the heat sink 210 is limited and an assembly time and cost are increased because the separate heat sinks 210 are connected to the printed circuit board 200.

In addition, a conventional technology for a metal PCB assembly for a vehicle lamp is proposed by Korean Patent No. 1589017. As shown in FIG. 3, the metal PCB assembly 30 for a vehicle lamp includes a metal PCB 34; at least one unit pattern (not shown) disposed on the metal PCB 34, having three faces cut and one face connected to the metal PCB 34, and inclined at a specific angle to the metal PCB 34 and protruded; and a projected matter coupled to the metal PCB 34, wherein a support part protruded from a horizontal surface supports the unit pattern to maintain a specific angle. The metal PCB 34 assembly includes a bending groove of a specific depth at the bottom of the metal board 34, and the unit pattern on which each LED is mounted is bent by forward pushing it based on the bending groove, thereby fabricating the metal PCB assembly 30 having a stepped shape with a small power.

In this case, the external three faces of the unit pattern are cut, and one face of the unit pattern has been integrated with the metal PCB 34. Accordingly, the unit pattern is not fully separated from the metal PCB 34, but is inclined and protruded at a specific angle with one side connected.

However, such a metal PCB assembly for a vehicle lamp has disadvantages in that it has a configuration in which the unit patterns are bent, the unit patterns must be spaced apart from each other in forming the external three faces for bending and it is difficult to mount the LED chips at a desired degree of integration.

A conventional technology for a metal printed circuit board has been proposed as a method of manufacturing a metal printed circuit board in Korean Patent No. 1435451. As shown in FIG. 4, the metal printed circuit board includes an insulating layer 320, a circuit layer 310 formed on the top surface of the insulating layer 320, and a metal layer 330 formed on the bottom surface of the insulating layer 320.

Furthermore, a linear groove 332 has been processed at the bottom surface of the metal layer 330. The metal printed circuit board is bent and formed along the groove, and an LED chip 300 is mounted on the metal printed circuit board, thereby providing the metal printed circuit board including the circuit layer 310, the insulating layer 320 and the metal layer 330.

Furthermore, the metal printed circuit board is bent and formed in the state in which the direct type LED chip 300 has been mounted and a light guide plate 340 is disposed on the same surface as the direct type LED chip 300 to perform a backlight unit function.

However, such a metal printed circuit board has a disadvantage in that it has a configuration also serving as a light guide plate and cannot be easily applied to a polygonal or multi-directional structure and it has a difficulty in its application because the LED chips radiate light in different directions when the metal printed circuit board is bent.

DISCLOSURE

Technical Problem

An object of the present invention for improving such conventional problems is to provide a metal PCB, which enables the implementation of desired and various illuminations by increasing the degree of integration of LED chips, enabling fabrication in various forms while facilitating the transfer of heat, and enabling the LED chip array of the same interval, a headlight module to which the metal PCB is applied, and a method of assembling the headlight module.

Furthermore, the present invention provides a metal PCB, which enables the coupling task of a metal PCB on which LED chips are mounted and a back plate to be performed easily and rapidly, enables accurate control of the angle of a mounting part while preventing damage to the metal PCB, minimizes an error rate upon assembly by simplifying the structure, enables a bending task and a mounting task to be performed at the same time, and facilitating the mounting and detachment of the metal PCB, a headlight module to which the metal PCB is applied, and a method of assembling the headlight module.

Technical Solution

In order to achieve the objects, the present invention provides a metal PCB, including a base of a metal material which is formed of a thin plate or has a specific thickness and is bent in a desired direction through bending grooves provided in a back surface, wherein cut faces of at least two parts are formed on one side of the base, spaced apart from one each other at a specific interval, disposed to be inclined at a specific angle to the base, and integrated with a plurality of chip mounting parts on which one or more LED chips are mounted, a headlight module to which the metal PCB is applied, and a method of assembling the headlight module.

Furthermore, there is provided a metal PCB wherein specific patterns are integrated with the metal PCB so that the LED chips are mounted on the base formed of a thermal conductor.

In addition, there is provided a metal PCB wherein in the metal PCB, the at least one LED chip mounted on the chip mounting part is disposed on the base generally at a regular interval.

Furthermore, there is provided a metal PCB wherein in the metal PCB, two or more bending grooves are formed on one side of the base and the base is bent based on the chip mounting part.

Furthermore, there is provided a metal PCB wherein the metal PCB is configured to have the base having the chip mounting part formed in a thin plate type and the chip mounting part bent based on the base or to have the base bent based on the chip mounting part.

Thereafter, there is provided a metal PCB wherein the metal PCB has a stack structure of a heat-dissipation plate formed of a thermal conductor and equipped with a plurality of chip mounting parts and a flexible board bonded to a top of the heat-dissipation plate through an adhesive layer, the flexible board includes LED chips corresponding to the chip mounting parts, respectively, and the adhesive layer has any one selected from thermal conductive adhesives, heat-dissipation adhesives, thermal adhesives and thermal conductive silicon adhesives.

Furthermore, there is provided a metal PCB wherein the base is selected from a shape bent in a stepped form or a shape inclined and bent at a different angle.

Furthermore, there is provided a metal PCB wherein the metal PCB has a first bending groove formed on the back surface of the base and a second bending groove formed on a back surface of the chip mounting part, the first and the second bending grooves have a combination of configurations being parallel to each other or forming a triangle, and the first and the second bending grooves are depressed in a shape selected from V, U and ⊏ shapes.

Furthermore, there is provided a plurality of metal PCBs disposed to be connected through a lead in a length direction.

Meanwhile, the present invention provides a headlight module to which a metal PCB is applied, wherein the headlight module has a configuration in which a back plate formed of a forming body extended in a specific length in accordance with a headlight housing and a metal PCB connected to the back plate and having a plurality of LED chips electrically connected thereto through patterns have been integrated and coupled through coupling means, in the metal PCB, the patterns are formed on a base made of metal and chip mounting parts having the LED chips mounted thereof are disposed to be bent, a coupling part of the back plate corresponding to the headlight housing is provided at a bottom of a body and a plurality of consecutive support surfaces is provided on the back plate, and a plurality of mounting parts having the same or different slopes are integrated and protruded from the top of the support surface.

Furthermore, there is provided a headlight module wherein the coupling means has one selected from bonding coupling, piece coupling and thermosetting coupling.

Furthermore, there is provided a headlight module wherein the coupling means includes a support jaw provided in the metal PCB and a combination of a latching hook and fixing hook coupled to the support jaw or the metal PCB and having an inclined surface thereon.

In addition, there is provided a headlight module wherein the board mounting part includes a triangular block protruded to have a slope on the support surface and a fixed jaw preventing the upward provided on one side.

Furthermore, there is provided a headlight module to which a metal PCB is applied, wherein the board mounting part includes triangular walls spaced apart and protruded on both sides to have a slope, a downward location determination jaw is provided on the inside of the wall, and an upward location determination jaw is provided on one side of the wall.

Furthermore, there is provided a headlight module to which a metal PCB is applied, wherein the board mounting part has location determination jaws formed on both sides so that the chip mounting parts having a slope and guide holes are mounted, and includes guide protrusions to correspond to the guide holes.

In addition, there is provided a headlight module to which a metal PCB is applied, wherein the back plate has an air flow hole depressed and formed in a portion coming into contact with the metal PCB.

Furthermore, there is provided a headlight module to which a metal PCB is applied, wherein the metal PCB is selected from a configuration of a thin plate type capable of easy bending without a change or a configuration capable of relative bending of the base or the chip mounting part based on the chip mounting part or the base through a plurality of bending grooves provided at the bottom of the chip mounting part or the base so that the base or the chip mounting part is bent, and the bending groove has a combination of configurations having adjacent portions being parallel to each other or forming a triangle and is depressed in a shape selected from V, U and ⊏ shapes.

Furthermore, there is provided a headlight module to which a metal PCB is applied, wherein the chip mounting part is bent at a specific angle with respect to the base through cut faces of two faces or more separated from the base.

In addition, there is provided a headlight module to which a metal PCB is applied, wherein the support surface is selected from a stepped type configuration or a configuration of an inclined shape having a different angle.

Furthermore, there is provided a headlight module to which a metal PCB is applied, wherein the metal PCB has a configuration in which a flexible board having the LED chip is bonded to a top of a heat-dissipation plate made of aluminum.

Meanwhile, the present invention provides a method of assembling a headlight module, including the steps of preparing a metal PCB which includes patterns so that a plurality of LED chips is mounted on a base made of metal equipped with bending grooves for multi-faced bending at a bottom of the base and a plurality of chip mounting parts is banked so that angles of the LED chips are relatively adjusted with respect to the metal PCB;

preparing a back plate in which board mounting parts, each one having a slope corresponding to the chip mounting part, are protruded forward from support surfaces; and coupling the chip mounting parts of the metal PCB to the back plate in an inclined state through coupling means when the metal PCB is coupled to the top of the back plate, wherein the coupling means, the board mounting parts, and the support surfaces are integrated in the back plate through a forming mold, a downward location determination jaw and upward location determination jaw preventing a downward and upward of the bent chip mounting part, respectively, are integrated in the support surface so that the angle of the chip mounting part is adjusted and firmly fixed when the metal PCB is coupled, and the coupling means includes a hook formed to couple the back plate and the metal PCB.

Furthermore, there is provided a method of assembling a headlight module, wherein the chip mounting parts and mounting surfaces are simultaneously formed on the metal PCB by pressing the chip mounting parts and the mounting surfaces using a mold formed to correspond to the board mounting parts and the support surfaces formed in the back plate.

Furthermore, there is provided a method of assembling a headlight module, wherein the chip mounting part is formed by blanking at least one side of the metal PCB by a pair of blanking molds in the state in which the pattern has been connected.

Advantageous Effects

As described above, in accordance with the present invention, desired and various illuminations can be implemented by increasing the degree of integration of LED chips, the transfer of heat is easy and various forms can be fabricated, and the LED chip array of the same interval is made possible.

Furthermore, in the present invention, the coupling task of the metal PCB on which the LED chips are mounted and the back plate are rapid, damage to the metal PCB is prevented, the angle of the mounting part can be accurately controlled, an error rate is minimized upon assembly by simplifying the structure, a bending task and a mounting task are performed at the same time, and the metal PCB can be easily mounted and detached.

BEST MODE

Figure 1:
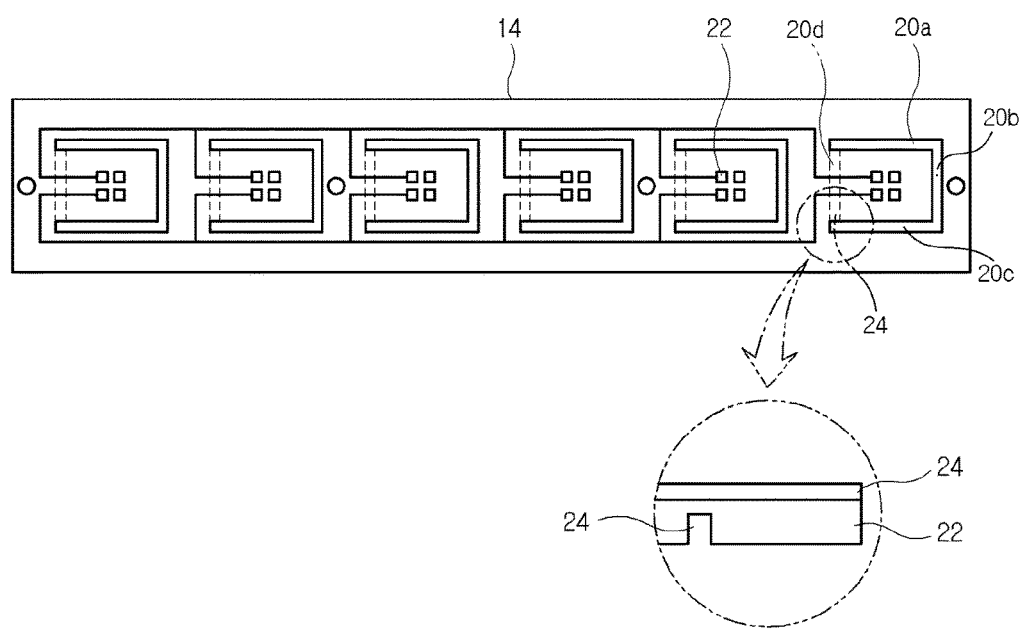
FIG. 1 is a plan view showing a conventional LED lamp module.
Figure 2:
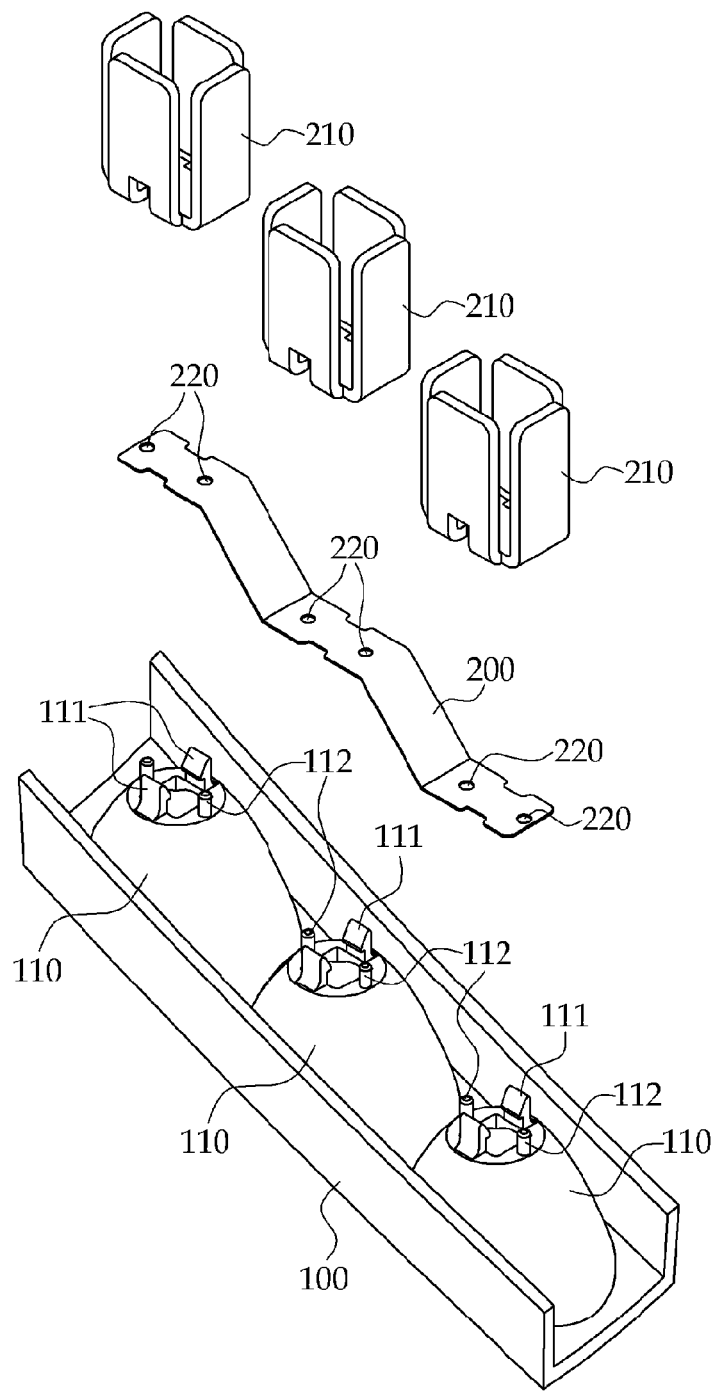
FIG. 2 is an exploded view showing a conventional LED lamp module.
Figure 3:
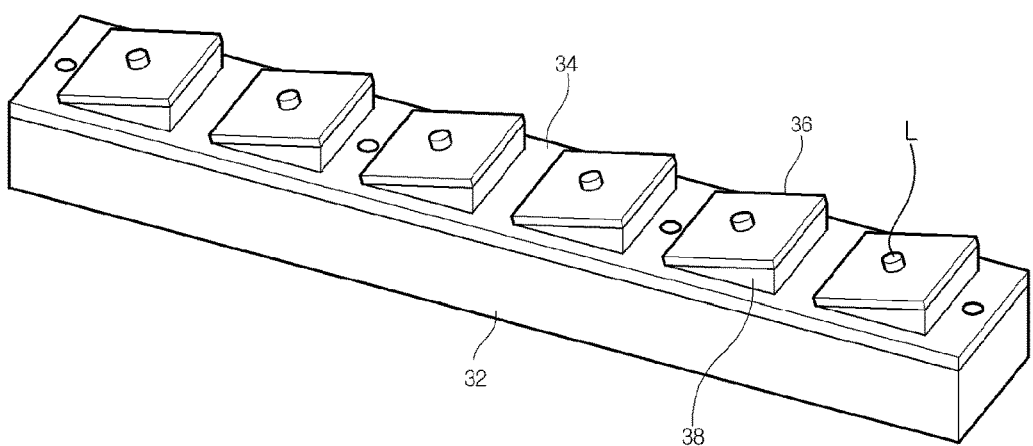
FIG. 3 is a perspective view showing a conventional LED lamp module.
Figure 4:
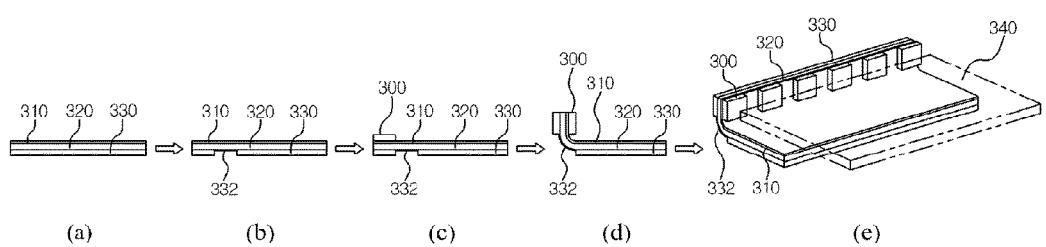
FIG. 4 is a flowchart showing a method of manufacturing a conventional metal printed circuit board.

Hereinafter, embodiments of the present invention are described in detail with reference to the accompanying drawings.

A metal PCB 500 of the present invention has a configuration in which patterns 503 are integrated so that LED chips 550 are mounted on a base 501, that is, a thermal conductor made of aluminum or copper.

Furthermore, in the metal PCB 500, a plurality of chip mounting parts 530 is formed in the base 501, at least one LED chip 550 is mounted on the mounting part 530, and the mounting part 530 is disposed to be connected to the base 501 through at least one portion.

In this case, the mounting part 530 is disposed to be split from the base through cut faces 580 of at least two parts on one side of the base.

In this case, the base 501 refers to a configuration in which the pattern is integrated on the top and a configuration in which a flexible board 540 is integrally bonded on the top of a heat-dissipation plate 510.

Furthermore, the at least one LED chip 550 is formed be mounted on the mounting part 530, and the LED chips are disposed generally at regular intervals on the metal PCB.

Furthermore, the three or more LED chips 550 are formed to be disposed on the mounting part 530 as a pair C, and the pairs or the LED chips are disposed to be spaced apart from each other at regular intervals.

In addition, the mounting part 530 is bent to have a slope through two or more bending grooves 570 on one side of the base.

In this case, the base 501 is disposed to maintain a specific tilt with respect to the mounting part.

Furthermore, in the metal PCB 500, a first bending groove 571 is formed in the back surface of the base, and a second bending groove 573 is formed in the back surface of the mounting part. The first and the second bending grooves have a combination of configurations that are parallel or form a triangle. The first and the second bending grooves are depressed in a form selected from V, U and ⊏ shapes.

In addition, a plurality of the metal PCBs is disposed to be connected through a lead (not shown) in the length direction.

Furthermore, the metal PCB 500 may be formed in a thin plate type T to be freely bent.

In this case, the metal PCB 500 may be formed in a thin plate type so that the mounting parts 530 are bent based on the base 501 or the base 501 is bent based on the mounting parts 530.

Furthermore, in the metal PCB 500, a protruded part 507 and a concave part 509 may be integrated in the length direction so that they are close to each other.

In addition, the mounting part 530 is formed to be integrated with one side of the base 501 through at least two portions.

Meanwhile, the metal PCB 500 of the present invention may have the assembly structure of the heat-dissipation plate 510 formed of a thermal conductor and equipped with the mounting part 530 whose angle is relatively adjusted with respect to the base 501 and the flexible board 540 bonded to the top of the heat-dissipation plate 510 through an adhesive layer 520.

Furthermore, the flexible board 30 includes the LED chips 31 corresponding to the respective mounting parts 13 and has a circuit pattern integrated and embedded therein so that the plurality of LED chips is connected at the same time.

In addition, the adhesive layer 520 is made of any one selected from thermal conductive adhesives, heat-dissipation adhesives, thermal adhesives and thermal conductive silicon adhesives.

Furthermore, the heat-dissipation plate 510 has a stepped shape or a shape inclined at a different angle.

In addition, the heat-dissipation plate 510 is selected from a thin plate type capable of free bending or a configuration having the plurality of bending grooves 570 in the base or the mounting part.

In this case, in the heat-dissipation plate 510, the mounting part is bent based on the base or the angle of the base is adjusted based on the mounting part so that the relative angles of the mounting part and the base are adjusted.

Meanwhile, a back plate 600 formed of a forming body extended in a specific length in accordance with a headlight housing (not shown) and the metal PCB 500 connected to the back plate 600 and having a plurality of LED chips mounted thereon through the patterns are coupled through coupling means 700.

Furthermore, the back plate 600 includes a plurality of support surfaces 613 in which coupling parts 611 corresponding to a headlight housing are consecutive at the top.

In addition, the coupling means 700 is formed of any one selected from bonding coupling 752, piece coupling 753 and thermosetting coupling 754.

Furthermore, board mounting parts 650 having the same or different slopes are protruded from the support surface 613 and formed at the top thereon.

Furthermore, the coupling means 700 includes a latching hook 712 or a fixing hook 714 formed to correspond to a support jaw 508 protruded from one side of the metal PCB 500 or formed to support one side of the board.

In this case, a through groove 716 is formed in the fixing hook 714 so that the support jaw is inserted into the through groove 716 and supported.

Furthermore, a location determination jaw 658 is protruded from the board mounting parts 650 on both sides of the top surface in order to prevent left and right movements when the mounting part 530 of the metal PCB is mounted. Guide protrusions 659 corresponding to the guide grooves 531 of the mounting part 530 are protruded from the board mounting parts 650.

In this case, the metal PCB 500 has a configuration in which the plurality of chip mounting parts 530 is provided on one side of the base 501. The mounting part and the base are inclined to have relative angles. The guide groove 531 is integrated on one side of the mounting part.

Furthermore, the metal PCB 500 has a configuration in which the flexible PCB 540 having the LED chips 550 are bonded to the top of the heat-dissipation plate 510 made of aluminum and having the mounting part 530s or a configuration of the base 501 in which the LED chips, the PCB and the heat-dissipation plate are integrated.

Thereafter, the metal PCB 500 is configured to have a thin plate capable of being bent and to be bent in a desired direction through the bending grooves 570 provided at the bottom. The mounting part is inclined at a specific angle on the base through the cut faces 580 of at least two parts.

Furthermore, an inclined surface S is integrated with one side of the latching hook, fixing hook and guide protrusions of the present invention.

Furthermore, the support surface has a configuration connected in a stepped form or a configuration connected in an inclined shape having a different angle.

Furthermore, the air flow hole 615 of the back plate 600 is depressed and formed in a portion that comes into contact with the metal PCB.

In addition, the mounting part 530 is formed to correspond to the size of a lens 545.

In this case, a space (not shown) is formed on the circumference of the mounting part 530.

In addition, the lead (not shown) connected to the pattern may be exposed on both ends of the metal PCB 500 so that a plurality of the leads is electrically connected.

Furthermore, the board mounting part 650 is equipped with a triangular block 651 having a slope, and may be configured to include a fixed jaw 652 having a hook shape that prevents the upward of the metal PCB mounted on one side of the block.

Meanwhile, the support parts 650 include triangular walls 654 spaced apart from each other and protruded on both sides to have a slope. The support part 650 may be configured to include a downward location determination jaw 655 that determines the downward location of the metal PCB within the wall and an upward location determination jaw 656 that determines the upward location of the metal PCB on one side of the wall.

In this case, one or more guide protrusions 659 are protruded on the internal surface of the wall, that is, on the downward location determination jaw.

Meanwhile, in the method of assembling the metal PCB according to the present invention, first, the metal PCB 500 and the back plate 600 are prepared.

In this case, in the metal PCB 500, patterns (not shown) that are electrically insulated are integrated on the base 501 made of metal so that the plurality of LED chips 530 is mounted.

Furthermore, metal copper clad laminate (MCCL) is used as the metal PCB 500.

In addition, the mounting parts 530 are performed by blanking at least one side of the metal PCB by a pair of blanking molds M1 in the state in which the patterns have been connected.

In this case, the chip mounting parts 530 are performed to have specific spaces spaced apart from the metal PCB.

Furthermore, the plurality of chip mounting parts 530 facing a surface different from the metal PCB 500 is spaded apart from the metal PCB 500 and formed so that the direction in which the LED chips 550 are mounted on the metal PCB 500, that is, a radiation angle is controlled, and power and a signal are supplied from the metal PCB 500 to the LED chips.

Thereafter, the bending grooves 570, such as V or U, are formed at the back of the metal PCB or the mounting parts through routing equipment 810.

In the metal PCB 500 having such a configuration, after the support surfaces 613 consecutive and bent at the same angle or different angles through the routing equipment 810 for multi-faced bending formed on the lower side are formed, the mounting parts 530 are formed in the support surfaces by blanking so that they are protruded at desired angles and bent with respect to the metal PCB.

In this case, the bending of the metal PCB 500 or the bending of the mounting parts 530 may be performed at a desired angle and combined when the metal PCB 500 or the mounting parts 530 are mounted on the back plate 600 using the coupling means 700.

Furthermore, in a task for directly coupling the metal PCB 500 to the back plate 600, the metal PCB 500 of a flat panel form and the back plate 600 bent in a specific form are inserted into a coupling mold M4 disposed to have corresponding shapes and integrated by pressurization.

Furthermore, the bending of the metal PCB 500 or the bending of the mounting part 530 is previously bent through a pair of bending molds M2 so that the metal PCB 500 or the mounting part 530 maintains a shape corresponding to the back plate 600. Accordingly, the metal PCB 500 or the mounting part 530 can be mounted on the back plate 600 more easily using the coupling means 700.

In this case, the back plate 600 is formed in the state in which the board mounting parts 650 have been protruded through the forming mold M3, and the coupling means 700 is also integrated.

Meanwhile, the back plate 600 of the present invention is integrated with the board mounting parts 650 so that the bottom has shapes corresponding to the coupling parts of the lamp housing and the top is protruded to correspond to the slope of the mounting part 530.

In this case, the board mounting part 650 includes the downward location determination jaw 655 that prevents the downward in order to prevent the downward and upward of the mounting part when the bent mounting part 530 is inserted and supported by the board mounting part 650. The board mounting part 650 is configured to include the upward location determination jaw 656 that determines the upward location of the metal PCB.

In addition, the downward location determination jaw 655 and the upward location determination jaw 656 are positioned and firmly fixed in the state in which they have been inserted by a press operation through the mold of the mounting part 530.

Furthermore, the board mounting parts 650 are protruded upward from the support surface 613 that is bent at the same or different angle on the back plate 600 and formed to correspond to the mounting surface of the metal PCB.

In addition, when a press operation using a mold for coupling the metal PCB 500 to the back plate 600 is performed, a hook is used as the coupling means 700 used for easy coupling in the present invention, but a coupling method through thermal fusion using a protrusion or a hole corresponding to the protrusion or bonding coupling may be used.

Furthermore, a middle forming step of previously bend and forming the metal PCB 500 through the pair of bending molds M2 so that the metal PCB is bent in accordance with the support surface of the back plate 600 and the board mounting parts and thus forming the mounting parts and the support surface may be further included in order to facilitate a task for coupling the metal PCB and the back plate.

Mode for Invention

The operation of the present invention configured as described above is described.

Figure 5:
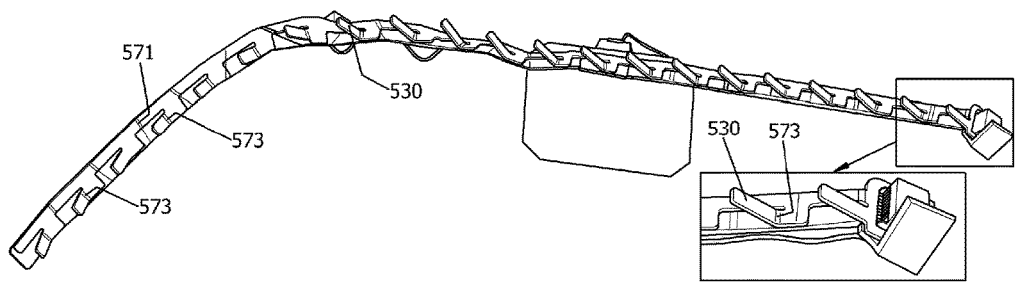
FIG. 5 is a perspective view showing a metal PCB according to the present invention.
Figure 6:
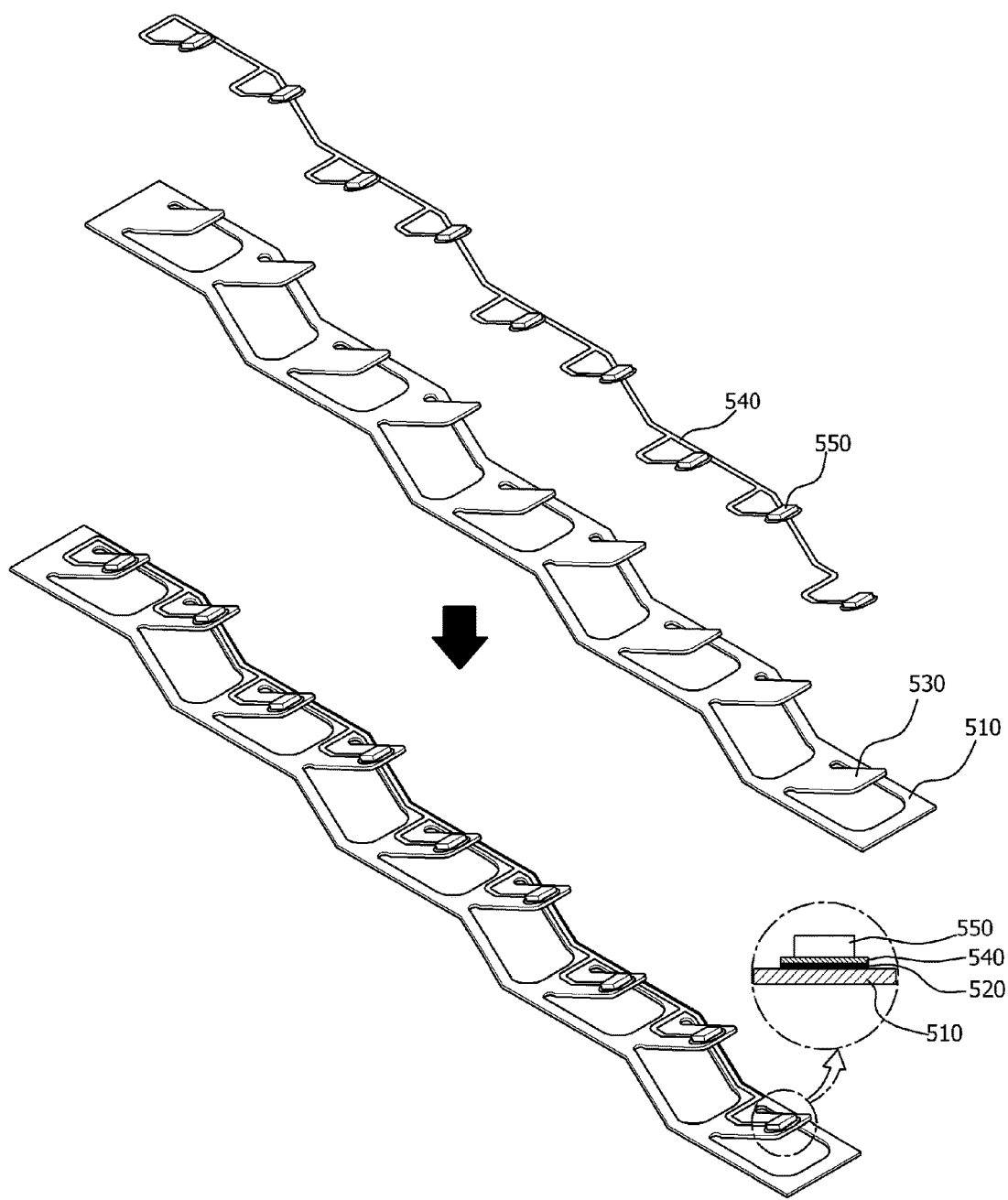
FIG. 6 is an exploded view of a metal PCB according to another embodiment of the present invention.
Figure 7:
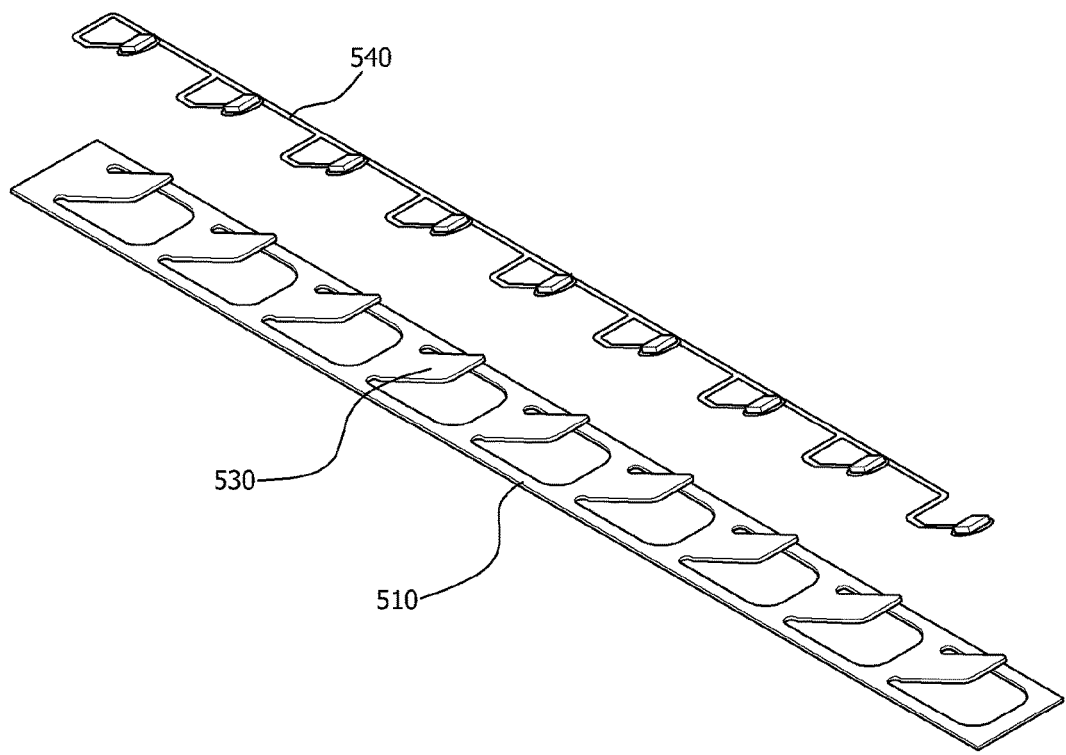
FIGS. 7 to 9 are external views of the metal PCB according to another embodiment of the present invention.
Figure 8:
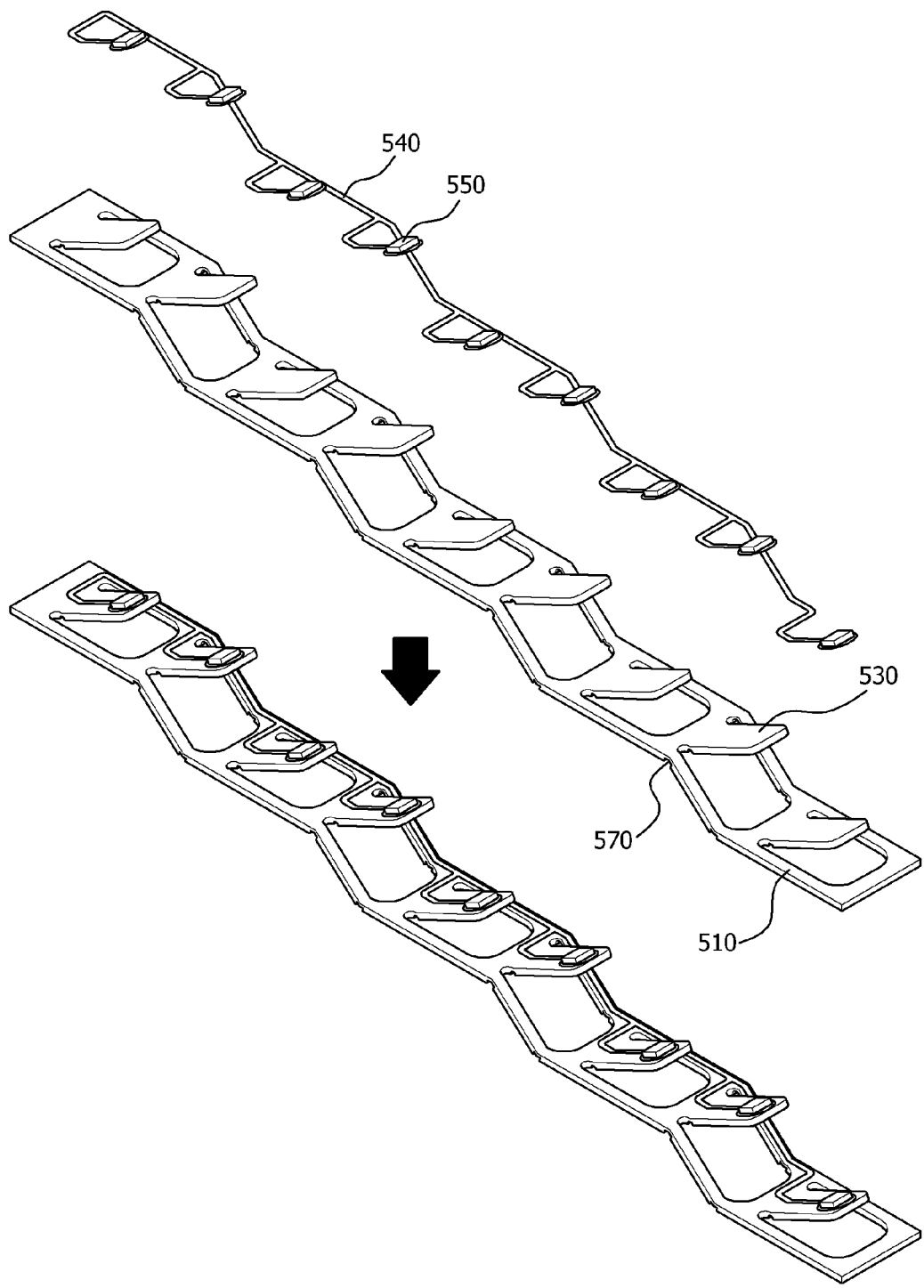
Figure 9:
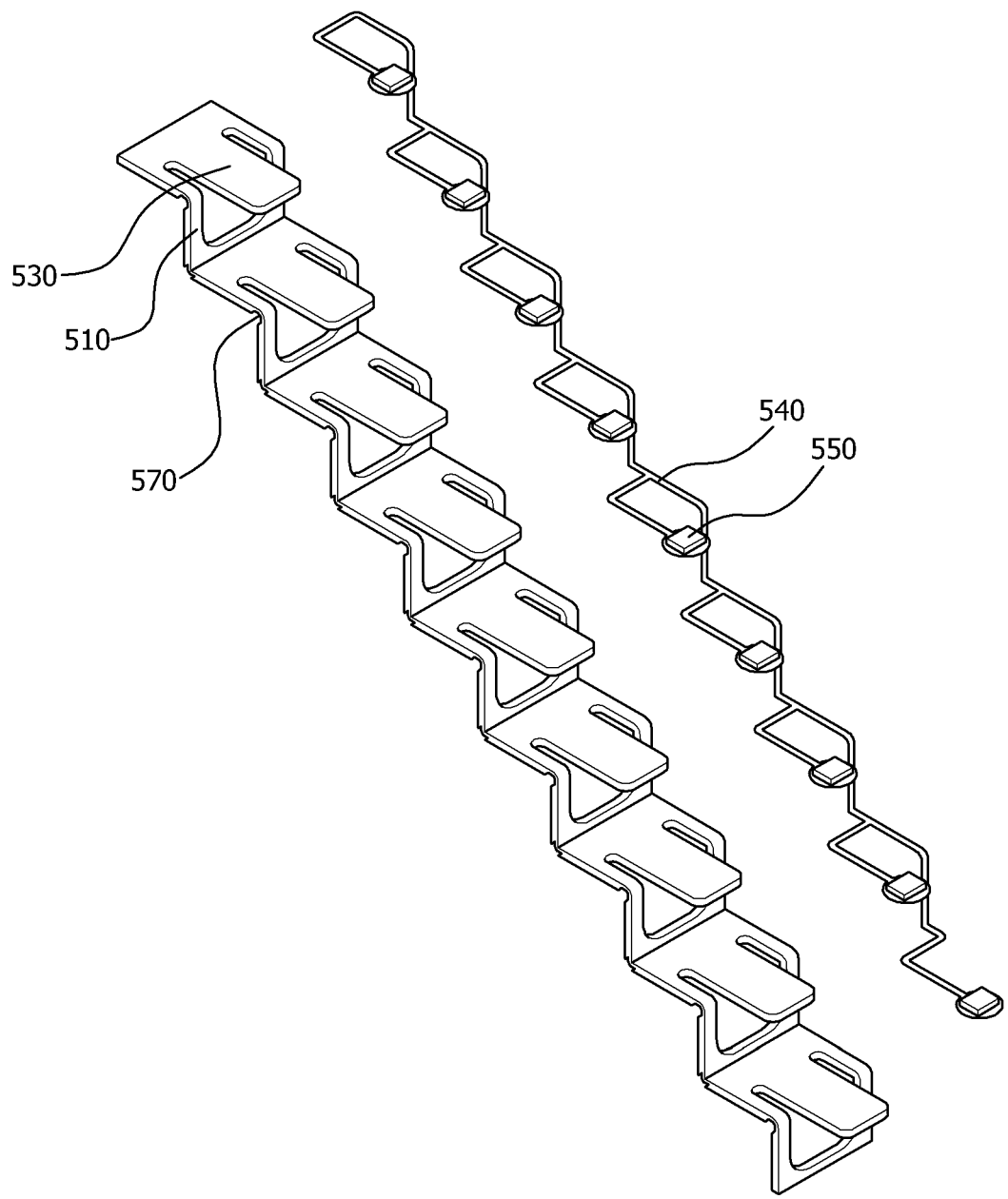
Figure 10:
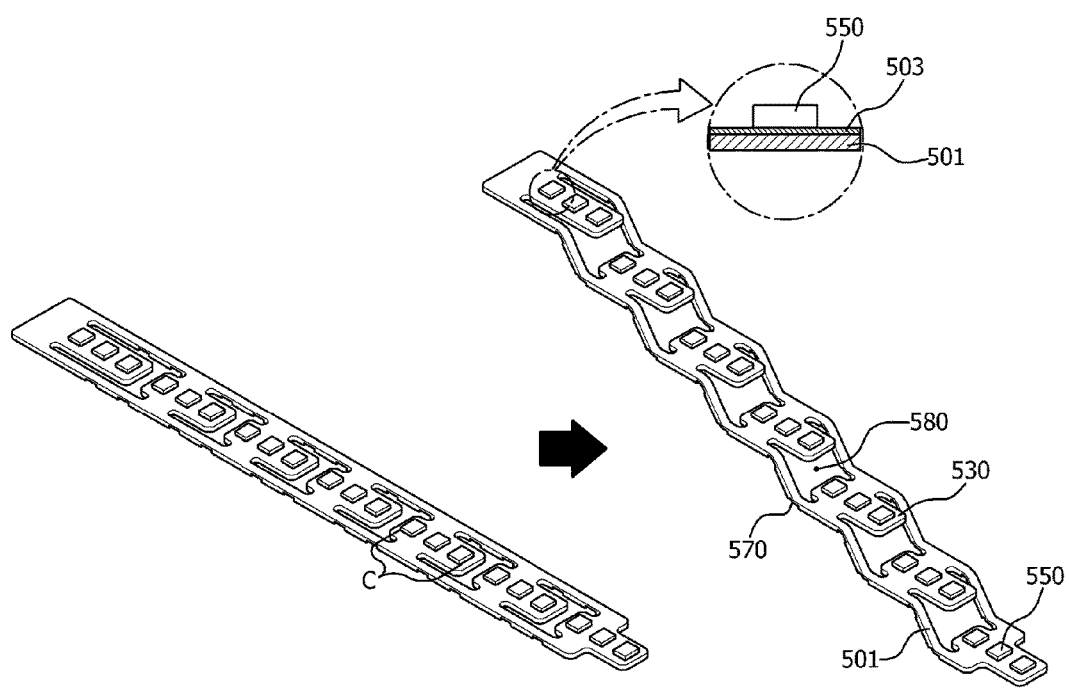
FIGS. 10 to 12 are external views of the metal PCB according to other embodiments of the present invention.
Figure 11:
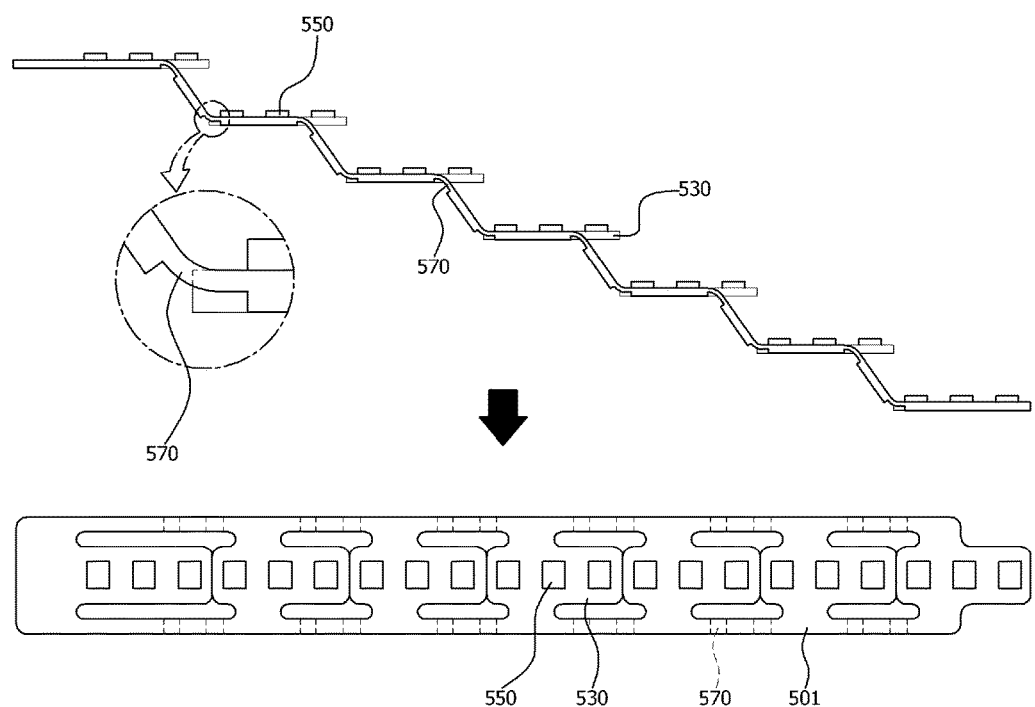
Figure 12:
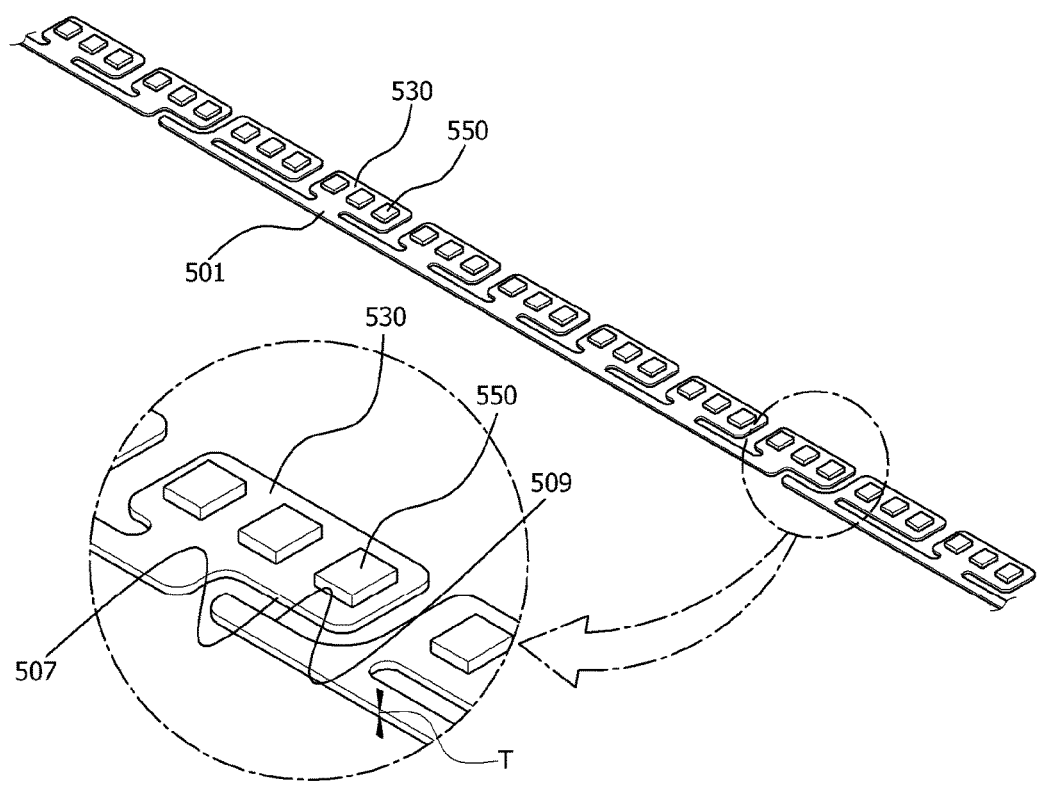
Figure 13:
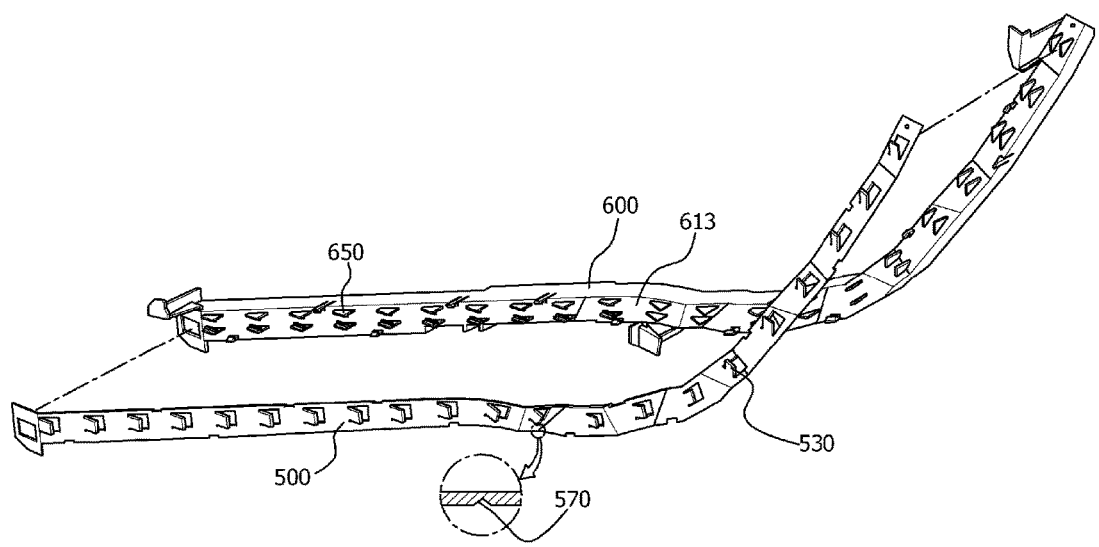
FIG. 13 is an external view showing a headlight module according to the present invention.
Figure 14:
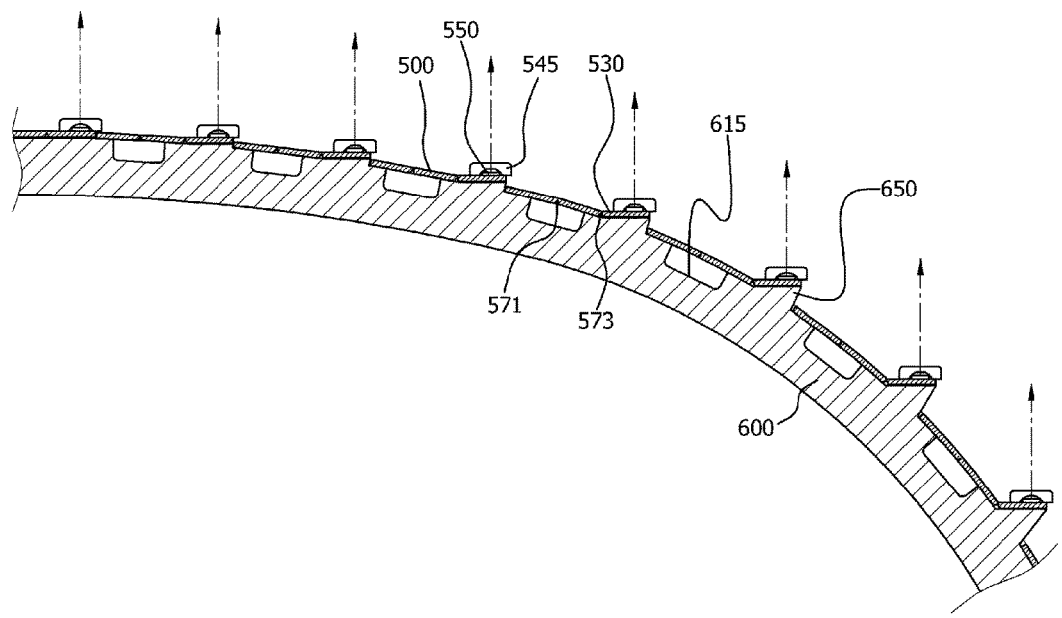
FIGS. 14 to 18 are coupling state diagrams of the metal PCB and back plate of the headlight module according to the present invention.
Figure 15:
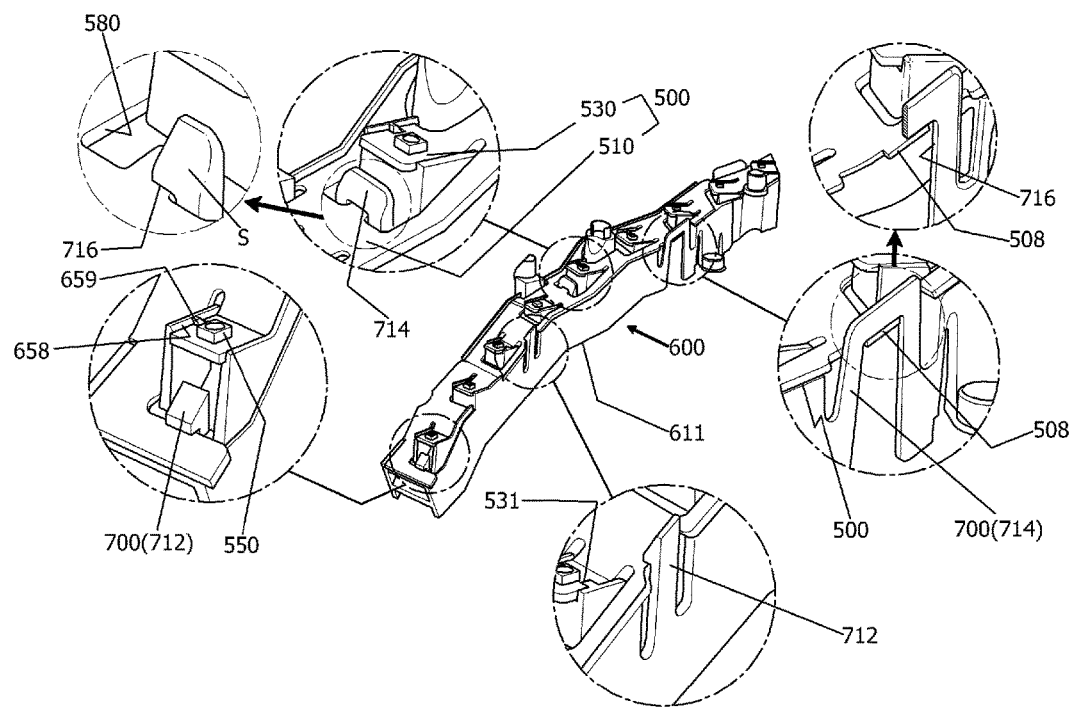
Figure 16:
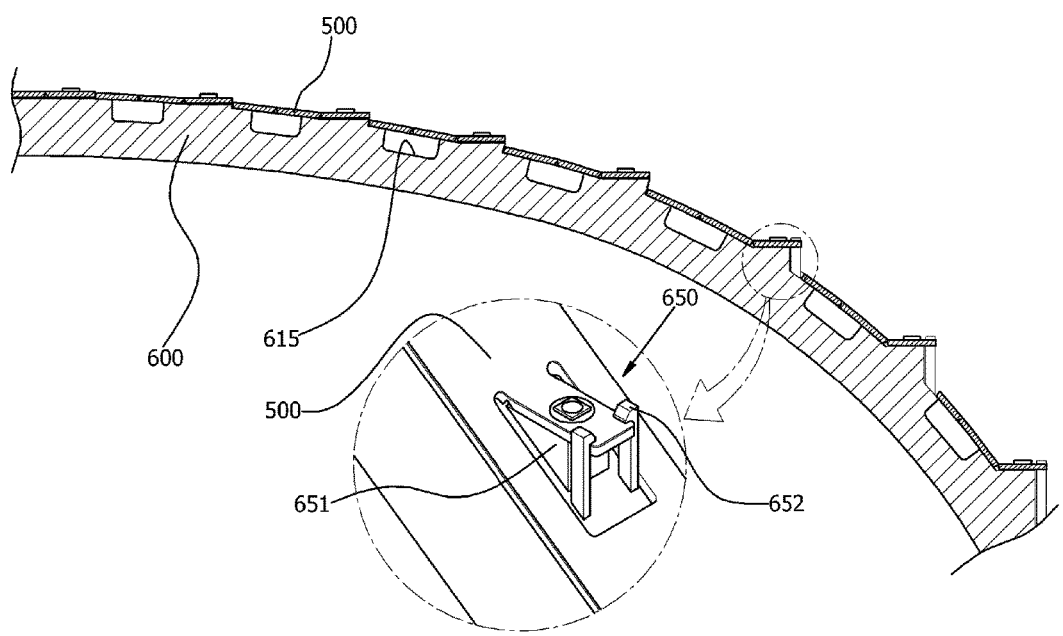
Figure 17:
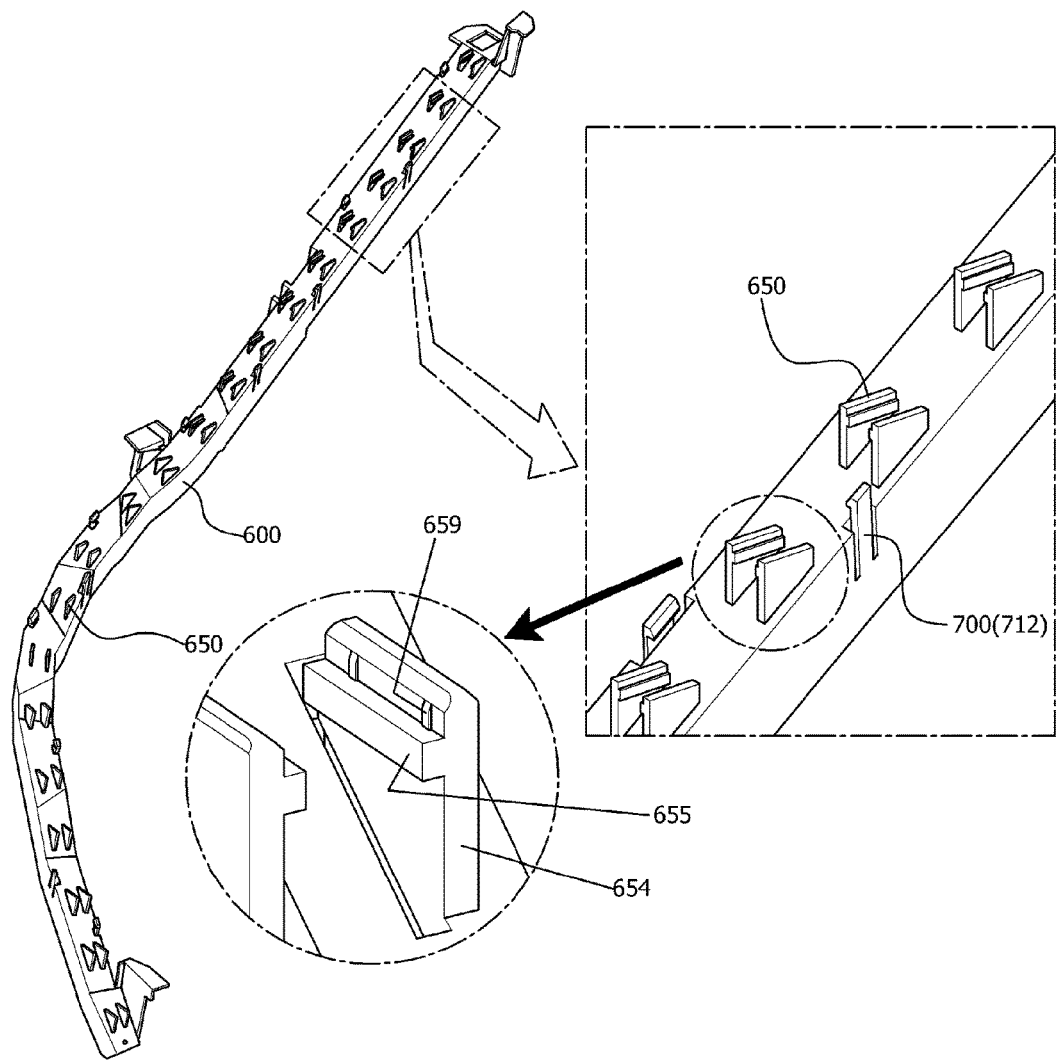
Figure 18:
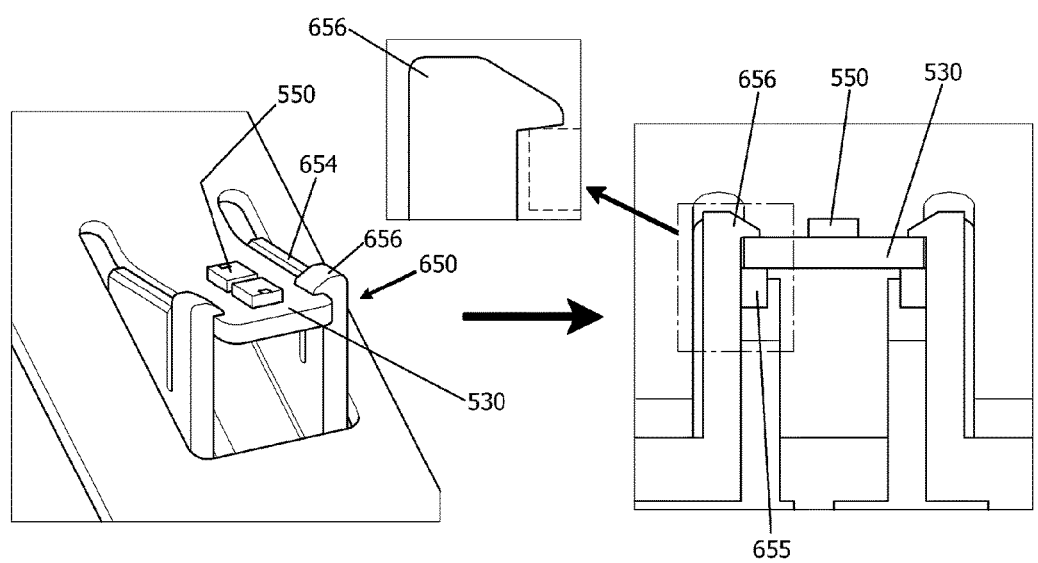
Figure 19:
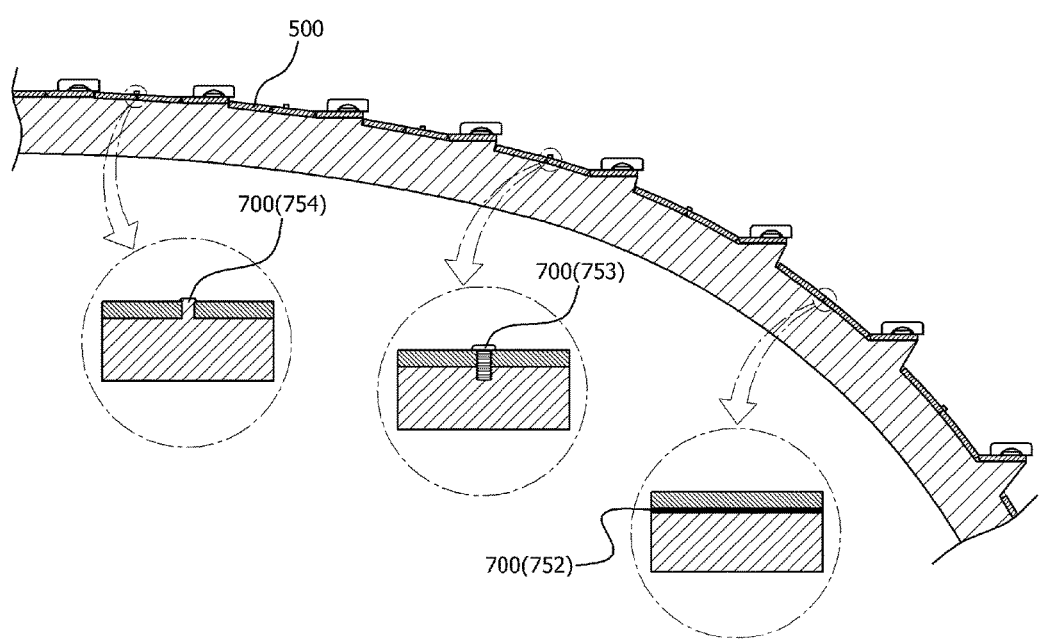
FIG. 19 is a coupling state diagram according to an embodiment of the headlight module according to the present invention.
Figure 20:
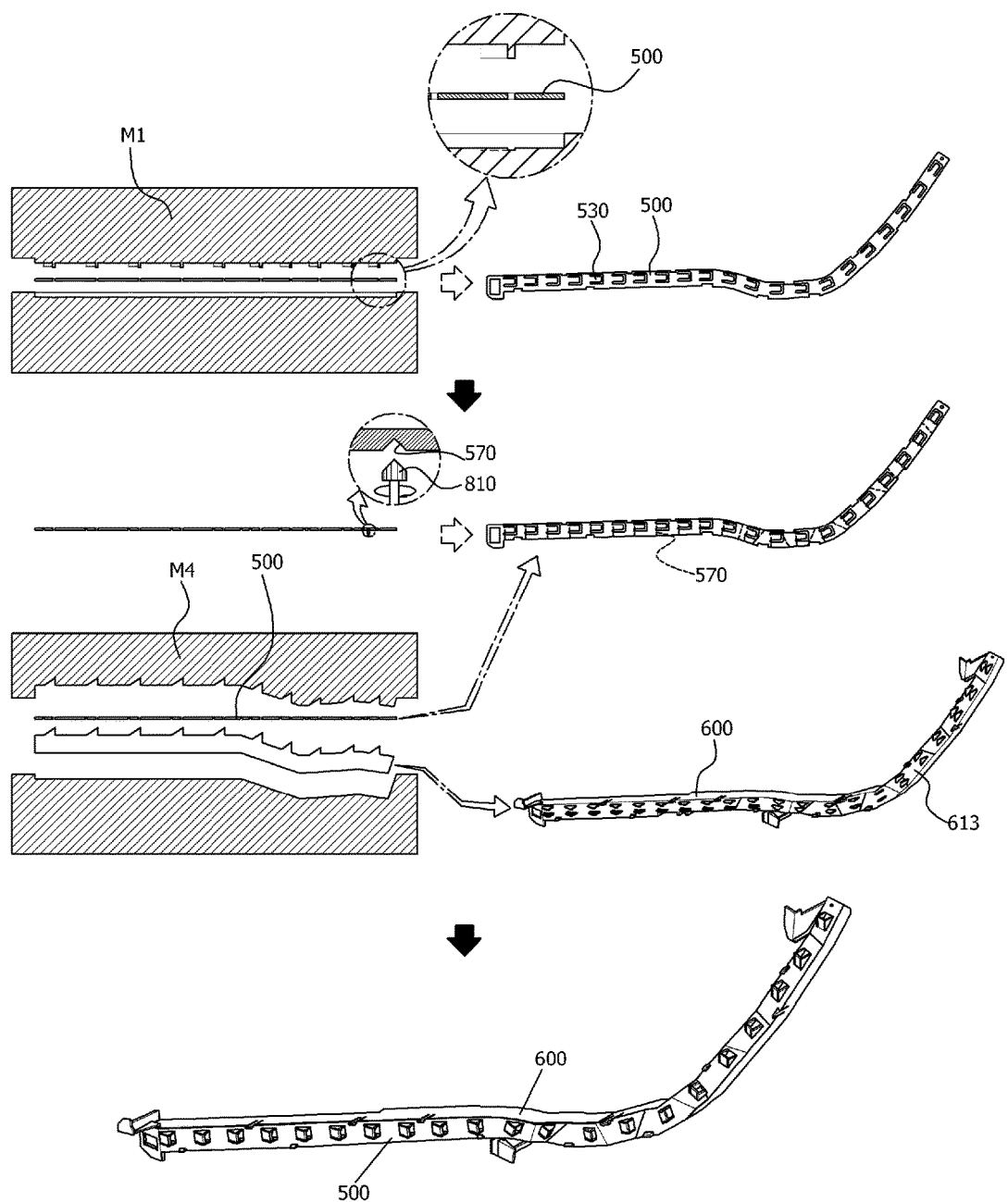
FIG. 20 is a flowchart showing a process of assembling the metal PCB according to another embodiment of the present invention.
Figure 21:
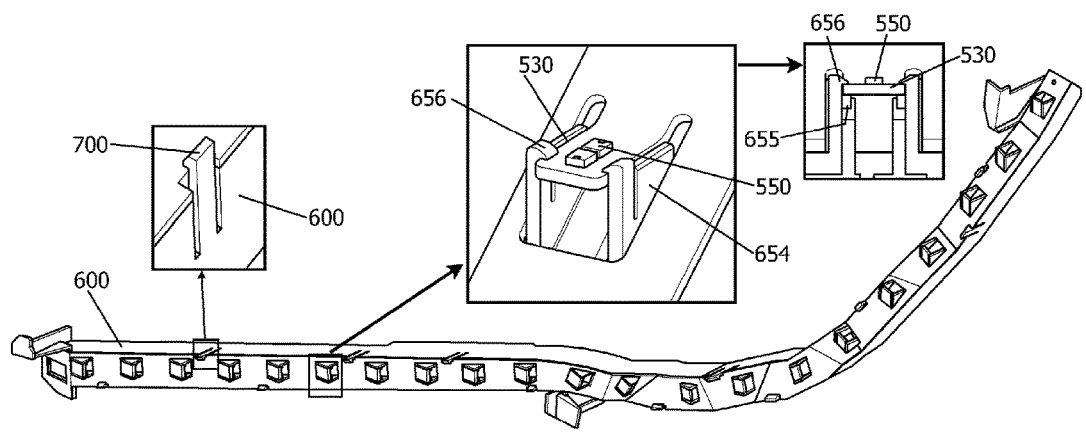
FIG. 21 is an assembly state diagram according to the metal PCB assembly process according to the present invention.
Figure 22:
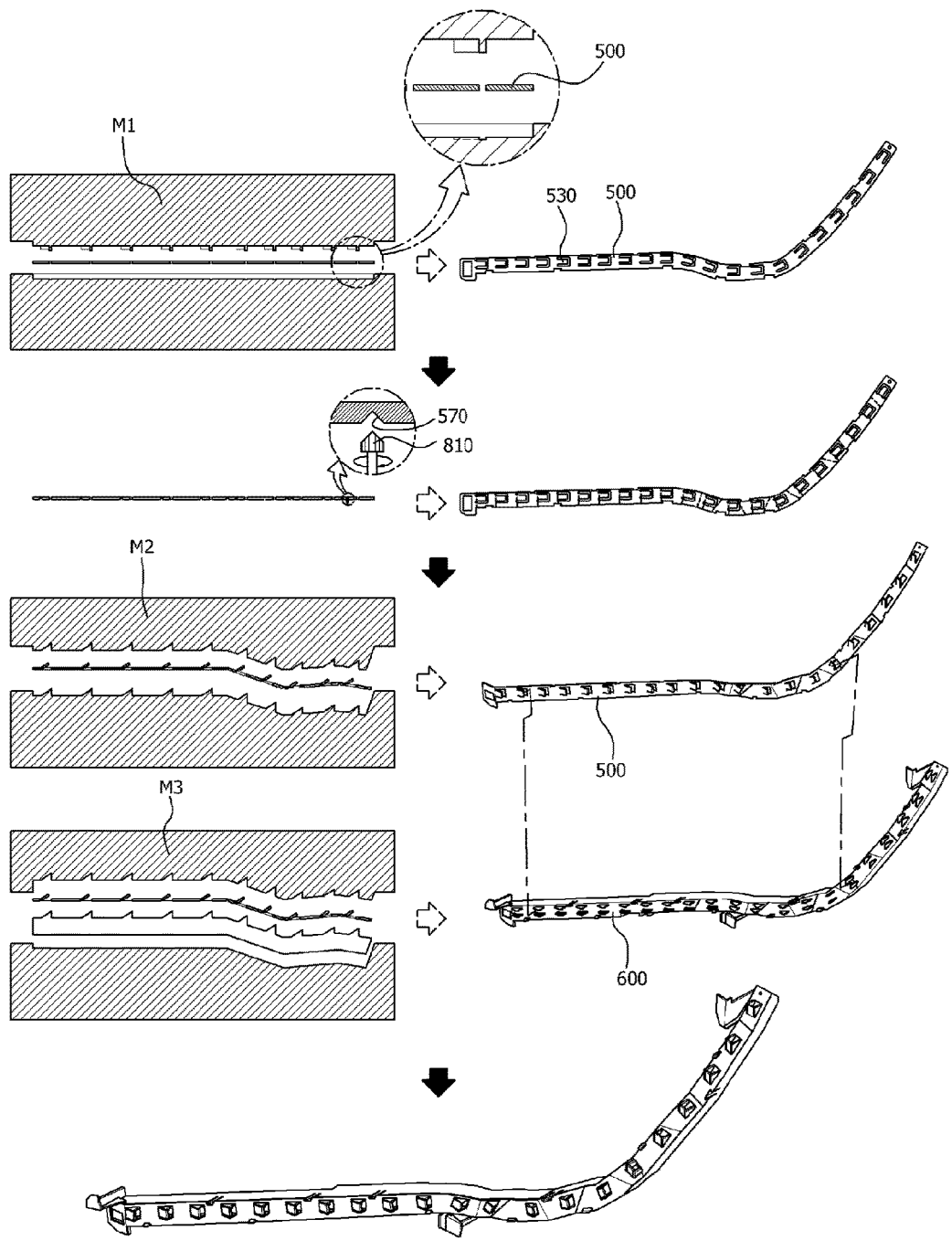
FIG. 22 is a flowchart showing a process of assembling the metal PCB according to another embodiment of the present invention.

As shown in FIGS. 5 to 22, the metal PCB 500 of the present invention has a configuration in which a thermal conductor of a sheet form made of aluminum or copper and the patterns for mounting the LED chips 550 thereon have been integrated. The metal PCB enables heat, discharged by the LED chips 550, to be easily discharged through the thermal conductor.

Furthermore, the metal PCB 500 includes the plurality of chip mounting parts 530 formed to have independent forms on one side of the base 501. The base 501 is bent in the state in which the mounting parts 530 have been fixed so that the mounting parts 530 remain parallel.

In this case, the two or more LED chips 550 are mounted on the mounting part 530 in order to solve a problem in that a reduction in the degree of integration generated when each LED chip is mounted on a conventional unit pattern is generated.

That is, when the mounting part 550 is connected to the base 501 through at least one portion, desired illumination can be implemented in a specific direction so that two or more LED chips are mounted and radiation is performed in the same direction.

Furthermore, the one or more LED chips 550 are mounted on the mounting part 530, and the LED chips are disposed generally at regular intervals on the metal PCB.

Furthermore, the mounting part 530 may be formed to have three or more LED chips 550 mounted thereon as a pair C, and the pair of mounting parts 530 may be spaced apart from each other at regular intervals.

In addition, in the mounting part 530, two or more bending grooves 570 are formed on one side of the base so that corresponding islands are parallel. Accordingly, the base 501 is bent in a desired direction and facilitates mounting.

In this case, when the base 501 is bent through two bending grooves, one side of the base connected to the mounting part and the other side of the base bent through the bending groove maintain a specific tilt.

Furthermore, the metal PCB 500 is formed in the thin plate type T and freely bent.

Furthermore, the metal PCB 500 includes the integrated protruded parts 507 and concave parts 509 in the length direction. When the protruded part 507 and the concave part 509 are disposed closely, the LED chips are disposed at the same intervals or the pairs are disposed at the same intervals.

Furthermore, the exploded surfaces 580 open or shut in the periphery of the mounting part in order to divide the mounting part 530 and the base 501 is integrated. Accordingly, an effect in that a contact with the air is easily cooled through the bending grooves provided in the base is improved.

Meanwhile, the metal PCB 50 includes the heat-dissipation plate 510 formed of a thermal conductor and having the mounting part 530 and the flexible board 540 boned to the top of the heat-dissipation plate 510 through the adhesive layer 520, thereby solving a problem in that the board is damaged upon fabrication by the bending of the existing metal PCB.

Furthermore, the flexible board 540 includes the LED chips 550 corresponding to the mounting parts 530, respectively, and has the circuit patterns integrated and embedded therein so that the plurality of LED chips is connected at the same time. Accordingly, when power is supplied, the plurality of LED chips operates at the same time.

In addition, the adhesive layer 540 is made of any one selected from thermal conductive adhesives, heat-dissipation adhesives, thermal adhesives and thermal conductive silicon adhesives so that heat generated from the LED chips are easily transferred to the heat-dissipation plate.

Furthermore, the heat-dissipation plate 510 has a stepped shape or a shape inclined at a different angle and is easily supported by a bracket (not shown) corresponding to a shape of the headlight housing on which the LED chips are mounted.

In addition, the heat-dissipation plate 510 is fabricated in a thin plate type that may be freely bent in such a way as to be easily bent at a desired angle. A portion of the heat-dissipation plate whose thickness is reduced is widened.

Furthermore, when the heat-dissipation plate is formed in a thickness having a desired heat-dissipation area not the thin plate type, the heat-dissipation plate can be bent at a desired angle through the plurality of bending grooves 570 provided in the base or the mounting part.

Thereafter, the heat-dissipation plate 510 has one selected from a thin plate type capable of free bending or a configuration having a plurality of bending grooves. The mounting part is bent based on the base or the angle of the base is adjusted based on the mounting part so that the angles of the mounting part and the base are relatively adjusted. Accordingly, the heat-dissipation plate 510 can be easily bent in a desired direction.

Furthermore, the back plate 600 is configured to have the coupling part 611 corresponding to the headlight housing at the bottom and to have the plurality of consecutive support surfaces 613 at the top. Accordingly, when the body is coupled to the headlight housing, the LED chips of the metal PCB 500 mounted through the support surfaces 613 have a radiation angle of a desired direction.

Furthermore, the board mounting parts 650 that maintain parallelism are formed on the top of the support surface 613 so that the mounting parts 530 of the board are mounted on the board mounting parts 650, respectively.

Furthermore, the coupling means 700 for coupling the metal PCB 500 to the back plate includes the latching hook 712 or fixing hook 714 so that the coupling means corresponds to the support jaw 508 protruded from the metal PCB or is supported by one side of the board. Accordingly, the task of coupling the board through the latching hook and the fixing hook is rapidly performed even without a separate device for coupling.

In this case, the fixing hook 714 is configured to have the through groove 716 formed therein so that the support jaw is inserted and supported by the fixing hook, thereby preventing the separation of the coupling of the board.

Furthermore, in the board mounting part 650, one configuration of the coupling means is a configuration in which the location determination jaws 658 are protruded on both sides at the top in order to prevent the left and right movements when the mounting parts 530 are mounted on the board. The guide protrusions 659 are protruded in accordance with the guide grooves 531 of the mounting part 530 so that the mounting parts are precisely positioned in the board mounting part.

Furthermore, the metal PCB 500 has the configuration in which the flexible PCB 540 having the LED chips 550 are bonded to the top of the heat-dissipation plate 510 made of aluminum and having the mounting part 530 or the configuration of the metal PCB 500 in which the LED chips, the PCB and the heat-dissipation plate are integrated so that various types of boards can be mounted on the metal PCB.

Thereafter, the metal PCB 500 is bent and formed in a desired direction through the thin plate or the bending groove 570 provided at the bottom. Accordingly, the mounting part is inclined at a specific angle and disposed on the base through the cut faces 580 of the at least two parts. Accordingly, the mounting part having an angle corresponding to the board mounting part can be formed.

Furthermore, the inclined surface S is integrated on one side of the latching hook, the fixing hook and the guide protrusion of the present invention, so the support jaw formed on one side of the board or formed in the board can easily enter the latching hook, the fixing hook and the guide protrusion and is coupled thereto.

Furthermore, the support surface is configured to be connected in a stepped form or configured to be connected in an inclined shape having a different angle so that the support surface can be modified suitably for various purposes.

Meanwhile, in the metal PCB 500 provided in the headlight module, the first bending groove 571 having a bending groove provided in the base and the second bending groove 573 that bends the mounting part based on the metal PCB are integrated with the metal PCB and the back surface of the mounting part, thereby facilitating bending in a desired direction.

In this case, the first and the second bending grooves 570 have straight lines that are parallel to each other or meet form a triangle, and are depressed in any one selected from V, U and ⊏ shapes, thereby facilitating bending based on the reference line of the straight line and enabling the slope of each face to be adjusted.

Furthermore, when the air flow hole 615 is depressed and formed in the portion that comes into contact with the metal PCB and combined with the metal PCB, the flow space of air is formed in the back plate 600, thereby improving heat-dissipation efficiency.

In this case, the back surface of the back plate 600 corresponds to the coupling part of the headlight case, and the top surface of the back plate 600 is formed to have the same plane or faces directed different directions to have a consecutive plane. Accordingly, the metal PCB 500 can be mounted on the coupling part in the same height.

Furthermore, the board mounting part 650 is integrated and protruded on the top surface of the back plate 600 so that it corresponds to the mounting part. Accordingly, when the metal PCB is coupled, the slope of the mounting part is accurately adjusted.

Furthermore, the coupling means 700 for coupling the back plate and the metal PCB has one configuration selected from the fixing hook 714 integrated with the body, the bonding coupling 752 provided in a bonding surface thereof, the piece coupling 753 that is common coupling means, and the thermosetting coupling 754 for inserting a protrusion protruded into the body into a groove formed in the metal PCB and fusing them.

In this case, if the fixing hook 714, such as that of the present invention, is used, detachment in addition to mounting is further facilitated.

In addition, the board mounting part 650 for supporting the mounting part of the metal PCB at a desired angle includes the triangular block 651 protruded to have a slope and the fixed jaw 652 of a hook shape supporting the upward on one side, thus supporting the positioning state of the mounting part 530.

Meanwhile, the board mounting part 650 includes the triangular walls 654 spaced apart on both sides to have a slope, and includes the downward location determination jaw 655 on the inside of the wall and the upward location determination jaw 656 on one side of the wall. Accordingly, the board mounting part 650 supports the positioning state of the mounting part 530 on which the LED chip 550 is mounted.

In this case, the LED chip 550 is positioned at a desired angle to radiate light in an accurate direction even without a change attributable to external vibration.

In addition, the one or more guide protrusions 659 are protruded and formed on the inside of the wall, that is, on the downward location determination jaw and are adjusted in response to the size of the metal PCB so that the side thereof is firmly closely attached thereto.

Thereafter, the board mounting part 650 further includes the inclined surface S on the triangular wall and one side of the hook in order to adjust a coupling force constantly regardless of the thickness of the metal PCB.

That is, as described above, the present invention provides the configuration in which the protruded portion is fabricated in various shapes so that the protruded portion is coupled to the back plate without a separate tool. Accordingly, the coupling task of the metal PCB and the back plate can be rapidly performed.

INDUSTRIAL APPLICABILITY

The present invention has a configuration in which the metal PCB to which an LED lamp is applied and the back plate assembled with the metal PCB are assembled in an integration form, and facilitates assembly and installation when the headlight module for a vehicle to which the LED lamp is applied is fabricated.

The invention claimed is:
1. A headlight module comprising:
a back plate having a body extended in a specific length in accordance with a headlight housing; and
a metal PCB connected to the back plate and having a plurality of LED chips mounted thereon through patterns integrated with the metal PCB, the metal PCB being coupled with the back plate through a coupler, wherein the patterns are formed on a base made of metal, and chip mounting parts having the LED chips mounted thereon are disposed to be bent,
wherein a coupling part of the back plate coupled to the headlight housing is provided at a bottom of the body and a plurality of consecutive support surfaces is provided on the back plate,
wherein a plurality of board mounting parts having identical or different slopes are integrated and protruded from respective tops of the plurality of consecutive support surfaces, and
wherein each of the chip mounting parts is bent at a specific angle with respect to the base through a cut face on the base.
2. A method of assembling a headlight module, comprising steps of:
preparing a metal PCB which includes patterns so that a plurality of LED chips is mounted on a base made of metal equipped with bending grooves for multi-faced bending at a bottom of the base, wherein a plurality of chip mounting parts is banked so that angles of the LED chips are relatively adjusted with respect to the metal PCB;
preparing a back plate in which board mounting parts, each one having a slope corresponding to the respective chip mounting part, protrude forward from support surfaces; and
coupling the chip mounting parts of the metal PCB to the back plate in an inclined state through a coupler when the metal PCB is coupled to a top of the back plate,
wherein the coupler, the board mounting parts, and the support surfaces are integrated in the back plate through a mold,
a downward location determination jaw and an upward location determination jaw preventing a downward and upward movement of each of the bent chip mounting parts, respectively, are integrated in each of the support surfaces so that an angle of each of the chip mounting parts is adjusted and firmly fixed when the metal PCB is coupled, and the coupler includes a hook to couple the back plate and the metal PCB.

3. The method of claim 2, wherein the chip mounting parts and the mounting surfaces are simultaneously formed on the metal PCB by pressing the chip mounting parts and the mounting surfaces using the mold formed to correspond to the board mounting parts and the support surfaces in the back plate.

4. The method of claim 2, wherein the chip mounting parts are formed by blanking at least one side of the metal PCB by a pair of blanking molds in a state in which the patterns have been connected.

5. A headlight module, comprising:

a back plate having a body extended in a specific length in accordance with a headlight housing; and a metal PCB connected to the back plate and having a plurality of LED chips mounted thereon through patterns integrated with the metal PCB, the metal PCB being coupled with the back plate through a coupler, wherein the patterns are formed on a base made of metal and chip mounting parts having the LED chips mounted thereon are disposed to be bent, wherein a coupling part of the back plate coupled to the headlight housing is provided at a bottom of the body and a plurality of consecutive support surfaces is provided on the back plate, wherein a plurality of board mounting parts having identical or different slopes are integrated and protruded from respective tops of the plurality of consecutive support surfaces, and wherein the coupler includes a latching hook and a fixing hook, each having an inclined surface thereon, and each of the latching hook and the fixing hook is coupled to a support jaw protruding from one side of the metal PCB.

6. The headlight module of claim 5, wherein each of the board mounting parts comprises:

a triangular block protruding from the back plate to have a slope on the respective support surface, and a fixed jaw disposed on one side of the triangular block to prevent an upward motion of the metal PCB.

7. The headlight module of claim 5, wherein each of the board mounting parts comprises:

triangular walls spaced apart from each other and each protruding from the back plate to have a slope, a downward location determination jaw disposed on an inside of each triangular wall, and an upward location determination jaw disposed on one side of each triangular wall.

8. The headlight module of claim 7, wherein each of the board mounting parts further comprises:

guide protrusions protruding on an inside of each triangular wall to be coupled to the guide holes.

9. The headlight module of claim 5, wherein the back plate has an air flow hole depressed and formed in a portion coming into contact with the metal PCB.

10. The headlight module of claim 5, wherein the metal PCB is a thin plate shape bending through a plurality of bending grooves provided at a bottom of the chip mounting part, and wherein the plurality of the bending grooves are arranged to be parallel to each other or to form a triangle, and one of the plurality of the bending grooves has one of V, U and C shapes.

11. The headlight module of claim 5, wherein one of the plurality of consecutive support surfaces is a stepped shape configuration or a configuration of an inclined shape having a different angle.

12. The headlight module of claim 5, wherein the metal PCB has a configuration in which a flexible board having the LED chips is bonded to a top of a heat-dissipation plate made of aluminum.

\* \* \* \* \*